United States Patent
Hirakawa

[11] Patent Number: 5,825,050
[45] Date of Patent: Oct. 20, 1998

[54] THIN FILM TRANSISTOR HAVING TAPERED ACTIVE LAYER FORMED BY CONTROLLING DEFECT DENSITY AND PROCESS OF FABRICATION THEREOF

[75] Inventor: Katsunori Hirakawa, Tokyo, Japan

[73] Assignee: NEC Corporation, Tokyo, Japan

[21] Appl. No.: 651,149

[22] Filed: May 21, 1996

[30] Foreign Application Priority Data

May 25, 1995 [JP] Japan ................................. 7-149739

[51] Int. Cl.⁶ .................................................. H01L 29/04
[52] U.S. Cl. ............................ 257/57; 257/623; 438/713
[58] Field of Search ................................. 257/57, 61, 66, 257/623; 438/713

[56] References Cited

U.S. PATENT DOCUMENTS 5,198,694  3/1993  Kwasnick et al. ........................ 257/57
5,311,040  5/1994  Hiramatsu et al. ........................ 257/57

FOREIGN PATENT DOCUMENTS

62-124775  6/1987  Japan .
2-2636     1/1990  Japan .
3-44032    2/1991  Japan .
3-114234   5/1991  Japan .

*Primary Examiner*—Mark V. Prenty
*Attorney, Agent, or Firm*—Foley & Lardner

[57] ABSTRACT

Defect density of amorphous silicon layers is increased from the lowest layer toward the highest layer by controlling one of or both of the pressure of gaseous mixture containing silane and hydrogen and the flow rate of the hydrogen, and a dry etching tapers both end portions of the amorphous silicon layers so as to improve the step coverage of a metal layer formed into source and drain electrodes.

13 Claims, 12 Drawing Sheets

THIN FILM TRANSISTOR HAVING TAPERED ACTIVE LAYER FORMED BY CONTROLLING DEFECT DENSITY AND PROCESS OF FABRICATION THEREOF

FIELD OF THE INVENTION

This invention relates to a thin film transistor and, more particularly, to a structure of a thin film transistor having a tapered active layer and a process of fabrication thereof by controlling a defect density.

DESCRIPTION OF THE RELATED ART

A thin film transistor is an indispensable part of an active matrix type liquid crystal display, and a large number of thin film transistors are arrayed over a substrate for forming pixels on the screen. A manufacturer is expected to enhance the resolution of the active matrix type liquid crystal display, and the thin film transistors are miniaturized for increasing the pixels.

The prior art thin film transistor is fabricated as follows. FIGS. 1A to 1E illustrate a typical example of the process of fabricating the thin film transistor.

The process sequence starts with a transparent substrate 1 of glass. Conductive material is deposited over the major surface of the transparent substrate 1, and the transparent substrate 1 is overlain by a conductive layer. A photo-resist etching mask is patterned on the conductive layer, and the conductive layer is selectively etched away so as to leave a gate electrode 2 on the transparent substrate 1.

Figure 1A:
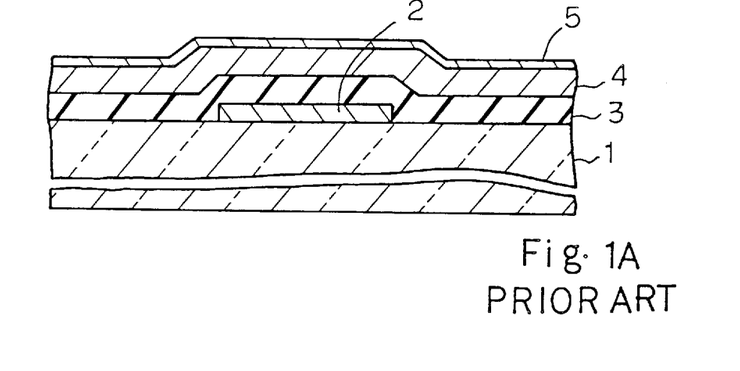
FIGS. 1A to 1E are cross sectional views showing the prior art process sequence.

Dielectric material is deposited over the gate electrode 2 and the exposed surface of the transparent substrate 1, and the transparent substrate 1 and the gate electrode 2 are overlain by an insulating layer 3. Amorphous silicon and n-type amorphous silicon are successively deposited over the insulating layer 3, and the insulating layer 3 is laminated with an amorphous silicon layer 4 and an n-type amorphous silicon layer 5. The resultant structure is illustrated in FIG. 1A.

Figure 1B:
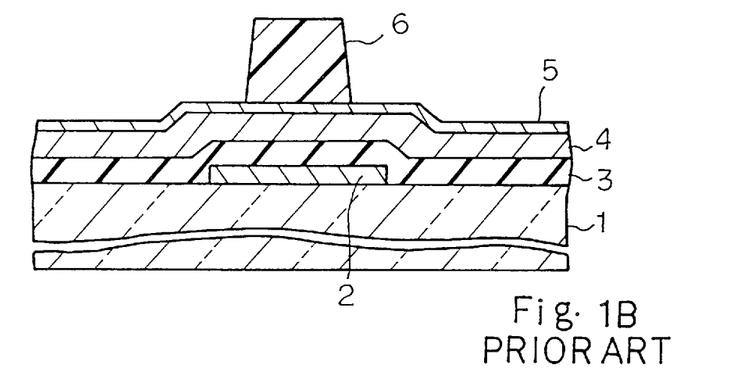

Photo-resist is spread over the entire surface of the n-type amorphous silicon layer 5, and the n-type amorphous silicon layer 5 is overlain by a photo-resist layer. A pattern image is optically transferred to the photo-resist layer, and the photo-resist layer is developed so as to provide a photo-resist etching mask 6 on the n-type amorphous silicon layer 5 as shown in FIG. 1B.

Figure 1C:
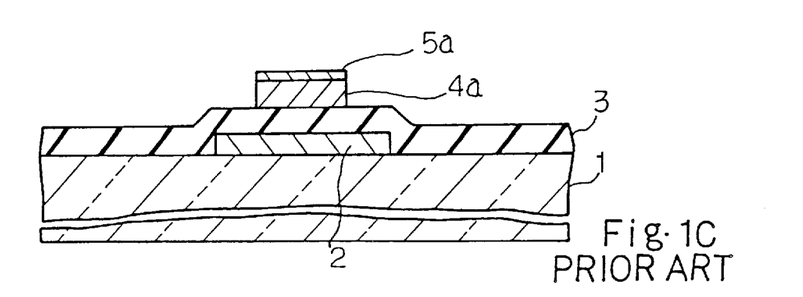

Using the photo-resist etching mask 6, a dry etching is applied to the n-type amorphous silicon layer 5 and the amorphous silicon layer 4, and the n-type amorphous silicon layer 5 and the amorphous silicon layer 4 are patterned into an n-type amorphous silicon strip 5a and an amorphous silicon strip 4a. Thereafter, the photo-resist etching mask 6 is stripped off, and the n-type amorphous silicon strip 5a and the amorphous silicon strip 4a are left over the gate electrode 2 as shown in FIG. 1C.

Figure 1D:
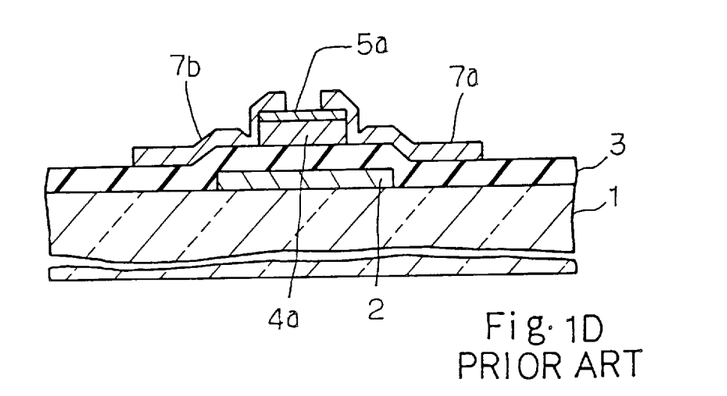

Subsequently, conductive material is deposited over the entire surface of the resultant structure shown in FIG. 1C, and a conductive layer topographically extends over the exposed surface of the gate insulating layer 3, the side surfaces of the amorphous silicon strip 4a and the side and upper surfaces of the n-type amorphous silicon strip 5a. The conductive layer is patterned into a source electrode 7a and a drain electrode 7b, and the source electrode 7a and the drain electrode 7b are held in contact with the amorphous silicon strip 4a and the n-type amorphous silicon strip 5a as shown in FIG. 1D.

Figure 1E:
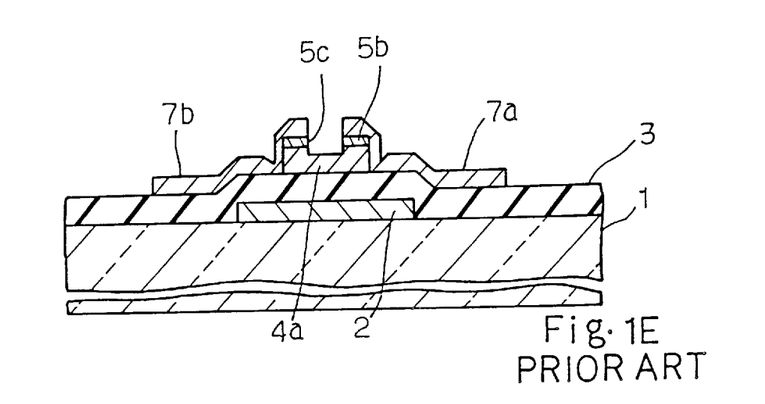

The a central area of the n-type amorphous silicon strip 5a is exposed between the source electrode 7a and the drain electrode 7b, and the central area is removed by using a dry etching. As a result, the source electrode 7a and the drain electrode 7b are respectively held on contact with n-type amorphous silicon pads 5b and 5c separated from each other as shown in FIG. 1E.

The thin film transistor fabricated through the prior art process encounters a problem in a low production yield due to a disconnection of the source/drain electrodes 7a/7b. As described hereinbefore, the conductive material is deposited over the laminated structure of the amorphous silicon strip 4a and the n-type amorphous silicon strip 5a, and the laminated structure makes the step coverage poor. For this reason, the disconnection is much liable to take place during the patterning step of the source and drain electrodes 7a and 7b, and the disconnected source/drain electrodes 7a/7b decrease the production yield.

A tapered configuration is effective against the poor step coverage. If the amorphous silicon strip 4a and the n-type amorphous silicon strip 5a are tapered from the central area toward both ends, the shoulders of the laminated structure are gentle, and the step coverage is improved.

Some tapering technologies have been proposed. One of the tapering technologies achieves the tapered configuration by using an isotropic etching, and typical examples are disclosed in Japanese Patent Publication of Unexamined Application Nos. 2-2636 and 3-114234. Japanese Patent Publication of Unexamined Application No. 2-2636 proposes to etch an amorphous silicon layer by using etching gas containing fluorine, and the etching step is corresponding to the step shown in FIG. 1B.

Another tapering technology is featured by stepwise narrowing a photo-resist etching mask as disclosed in Japanese Patent Publication of Unexamined Application No. 62-124775. FIGS. 2A to 2D illustrates the tapering technology. A conductive gate electrode 11 is patterned on a transparent substrate 12 of glass, and a gate insulating layer 13 covers the conductive gate electrode 11 and the major surface of the transparent substrate on both sides of the conductive gate electrode 11. The gate insulating layer 13 is overlain by an amorphous silicon layer 14a, and a photo-resist etching mask 15a is patterned on the amorphous silicon layer 14a. The original photo-resist etching mask 15a has a width W1.

Figure 2A:
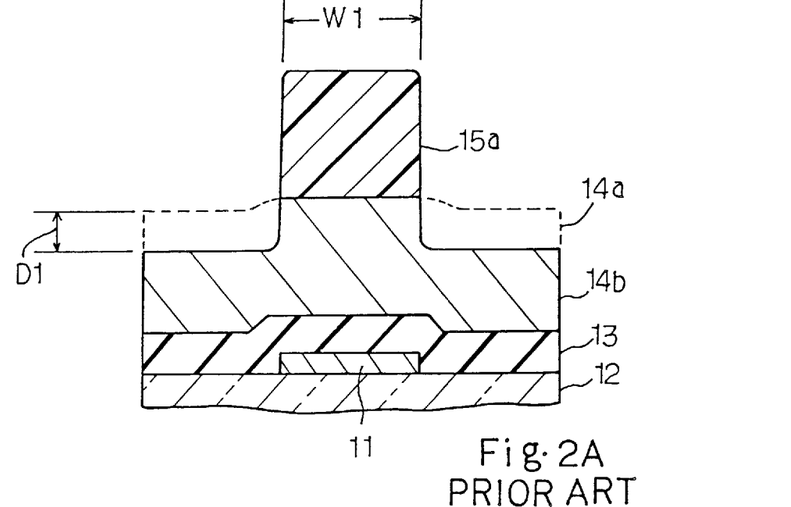
FIGS. 2A to 2D are cross sectional views showing the prior art tapering process.

Using the photo-resist etching mask 15a, the amorphous silicon layer 14a is etched by a first predetermined depth D1, and the etchant shapes the amorphous silicon layer 14a to an amorphous silicon layer 14b as shown in FIG. 2A.

Figure 2B:
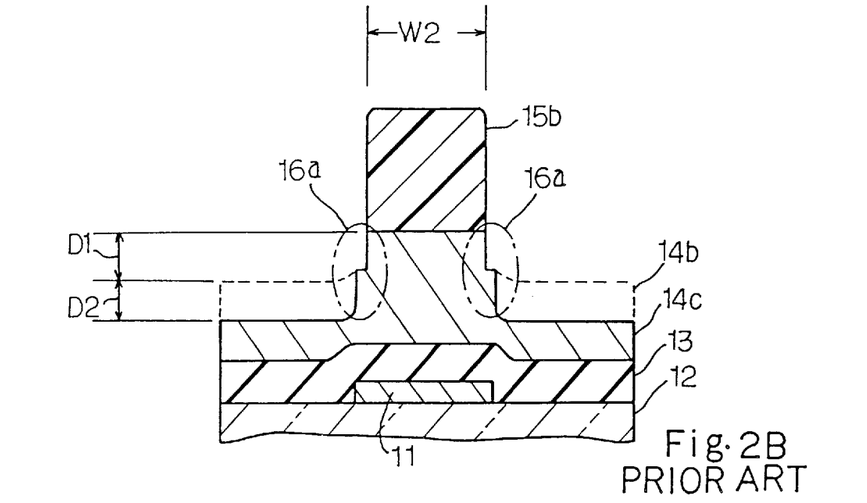

Subsequently, the photo-resist etching mask 15a is partially etched, and is shaped into a photo-resist etching mask 15b as shown in FIG. 2B. The photo-resist etching mask 15b has the width W2 narrower than the width W1. Using the photo-resist etching mask 15b, the amorphous silicon layer 14b is etched by a depth D2, and the amorphous silicon layer 14b is shaped into an amorphous silicon layer 14c. Steps 16a take place in the amorphous silicon layer 14c due to the difference between the width W1 and the width W2.

Figure 2C:
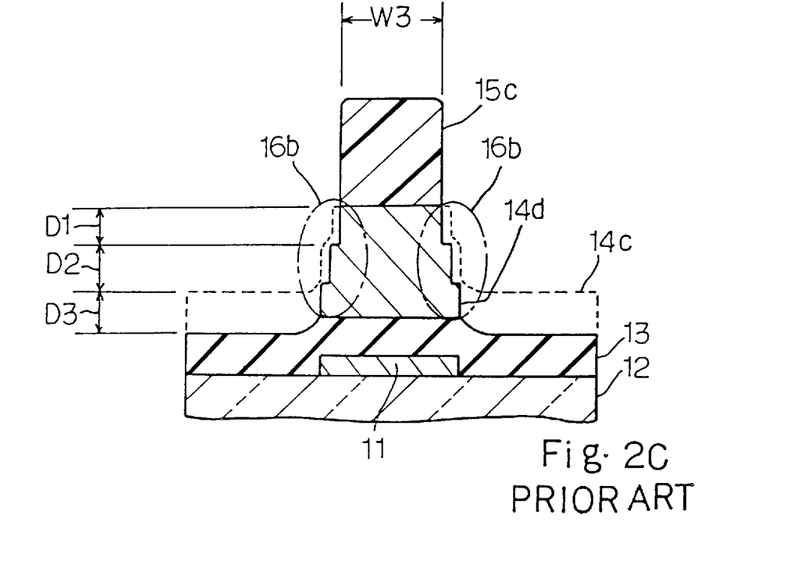

The photo-resist etching mask 15b is partially etched, again, and is shaped into a photo-resist etching mask 15c as shown in FIG. 2C. The photo-resist etching mask 15c has the width W3 narrower than the width W2. Using the photo-resist etching mask 15c, the amorphous silicon layer 14c is etched by a depth D3, and the amorphous silicon layer 14c is shaped into an active layer 14d. Steps 16b take place due to the difference between the width W2 and the width W3, and the active layer 14d has a stepped configuration on both sides thereof. An envelop of the stepped configuration is approximated to a taper or a gentle shoulder.

Heavily doped n-type amorphous silicon layers 17a and 17b are formed on the steps 16b. Conductive metal is deposited over the entire surface of the structure, and a conductive metal layer is held in contact with the heavily doped n-type amorphous silicon layers 17a and 17b. The conductive metal layer is patterned into a source electrode 18a and a drain electrode 18b a shown in FIG. 2D.

Figure 2D:
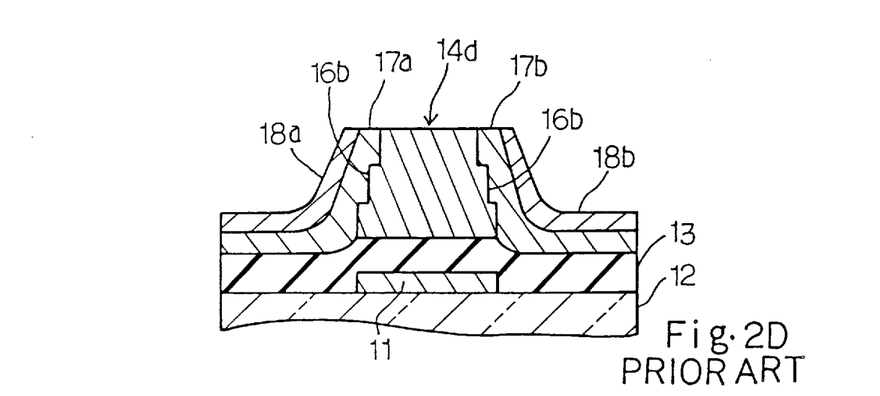

The steps 16b improves the step coverage of the conductive metal layer, and prevent the source electrode 18a and the drain electrode 18b from a disconnection.

Yet another tapering technology is disclosed in Japanese Patent Publication of Unexamined Application No. 3-44032, and is applied to a polysilicon wiring strip. A dopant impurity is introduced into an upper surface portion of a polysilicon layer so as to partially enhance the etching rate. When the polysilicon strip is etched, the polysilicon layer is tapered due to the difference in the etching rate. However, this technology is not applied to a thin film transistor, because the introduced dopant impurity increases the leakage current. In other words, the introduced dopant impurity destroys the switching action of the thin film transistor due to the large leakage current.

Thus, various tapering technologies have been proposed. However, the prior art tapering technologies encounter the following problems.

The first prior art tapering technology using the isotropic etching does not achieve a gentle sloop. The tapered configuration is steep, and the improvement of the step coverage is insufficient.

Although the second prior art achieves a good step coverage, the etching process is complex, and the reproducibility is poor. As described hereinbefore, the photo-resist etching mask 15a/15b and the amorphous silicon layer 14a/14b/14c are alternately patterned so as to form the stepped configuration 16b, and such an alternating pattern formation makes the tapering technology complicated. Moreover, the photo-resist etching mask 15a/15b/15c is stepwise narrowed through the etching, and it is impossible to precisely reproduce the photo-resist etching masks 15a/15b/15c.

SUMMARY OF THE INVENTION

It is therefore an important object of the present invention to provide a thin film transistor the structure of which improves the production yield.

It is also important object of the present invention to provide a process of fabricating a thin film transistor which is simple and improves a step coverage at high reproducibility.

To accomplish the object, the present invention proposes to change a defect density for varying an etching rate.

In accordance with one aspect of the present invention, there is provided a thin film transistor comprising: a gate electrode formed on an insulating layer; a gate insulating layer covering the gate electrode; a multiple-layer semiconductor structure having a central portion and shoulder portions downwardly declining from the central portion, and having at least a lower semiconductor layer formed on the gate insulating layer and an upper semiconductor layer formed over the lower semiconductor layer larger in defect density than the lower semiconductor layer; heavily doped semiconductor strips respectively held in contact with the shoulder portions; and source and drain electrodes respectively held in contact with the heavily doped semiconductor strips.

In accordance with another aspect of the present invention, there is provided a process of fabricating a thin film transistor, comprising the steps of: a) patterning a gate electrode on an insulating layer; b) covering the gate electrode and an exposed surface of the insulating layer with a gate insulating layer; c) depositing semiconductor layers by using a chemical vapor deposition where at least one depositing condition is varied in such a manner as to increase a defect density from a lower semiconductor layer to an upper semiconductor layer; d) etching the semiconductor layers so as to form shoulder portions downwardly declining toward both ends of the semiconductor layers; and e) forming a source electrode and a drain electrode on the shoulder portions, respectively.

BRIEF DESCRIPTION OF THE DRAWINGS

The features and advantages of the thin film transistor and the process of fabrication thereof according to the present invention will be more clearly understood from the following description taken in conjunction with the accompanying drawing in which.

DESCRIPTION OF THE PREFERRED EMBODIMENTS

First Embodiment

FIGS. 3A to 3D illustrate a process of fabricating a thin film transistor embodying the present invention. The thin film transistor is of a inverse-staggered channel-etching type. The process sequence starts with preparation of a transparent substrate 21, and the major surface of the transparent substrate 21 is coated with a conductive film of chromium. The conductive film is patterned into a gate electrode 22, and silicon nitride is deposited over the gate electrode 22 and the exposed major surface of the transparent substrate 21 by using a plasma-assisted chemical vapor deposition. As a result, the gate electrode 22 and the exposed major surface are overlain by a gate insulating layer 23 of silicon nitride.

Using the plasma-assisted chemical vapor deposition system, intentionally undoped or lightly doped amorphous silicon layers 24a, 24b and 24c are successively deposited over the gate insulating layer 23, and a heavily doped n-type amorphous silicon layer 25 is finally deposited on the intentionally undoped or lightly doped amorphous silicon layer 24c. In this instance, the intentionally undoped or lightly doped amorphous silicon layers 24a to 24c are equal to or less than $1\times10^{18}$ cm$^{-3}$, and the dopant concentration of the heavily doped n-type amorphous silicon layer 25 is of the order of $1\times10^{19}$ cm$^{-3}$.

Gaseous mixture of silane (SiH$_4$) and hydrogen (H$_2$) is supplied to the reaction chamber of the plasma-assisted chemical vapor deposition system, and the flow rate of the silane and the flow rate of the hydrogen are regulated to 300 sccm and 800 sccm, respectively, and the silane is pyrolyzed under the rf power of 100 watts.

Figure 4:
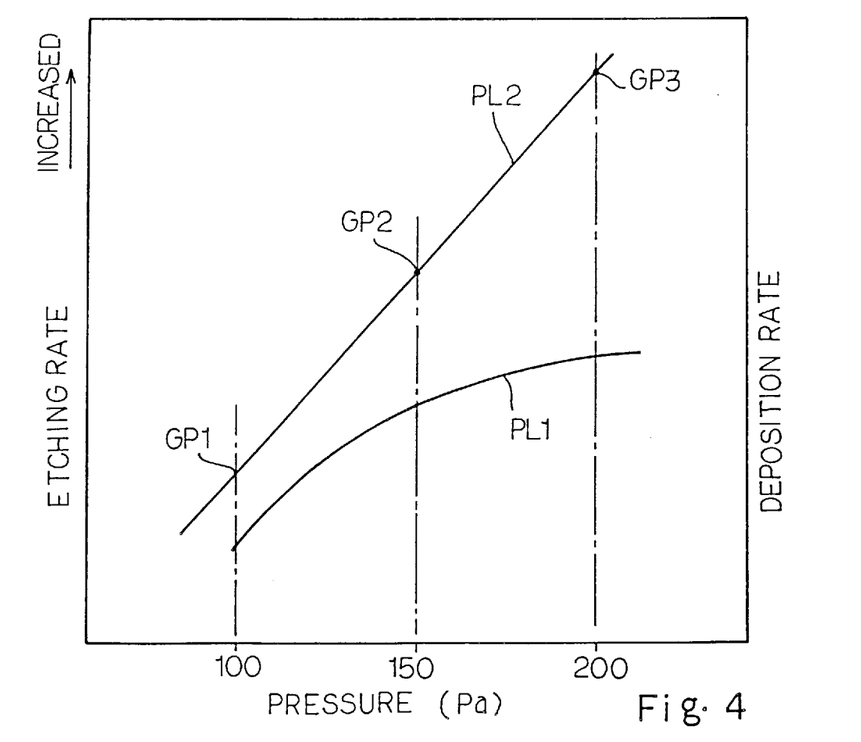
FIG. 4 is a graph showing an etching rate and a deposition rate in terms of pressure of a process gas.

While the intentionally undoped or lightly doped amorphous silicon is being deposited, the pressure of the gaseous mixture is stepwise increased. This is because of the fact that the etching rate is increased together with the pressure. In detail, when the pressure is increased, the deposition rate is non-linearly increased as indicated by plots PL1 (see FIG. 4), and the etching rate of the deposited amorphous silicon layer is linearly increased as indicated by plots PL2.

The lower intentionally undoped or lightly doped amorphous silicon layer 24a is deposited at a low gas pressure GP1, and the intermediate intentionally undoped or lightly doped amorphous silicon layer 24b is deposited at an intermediate gas pressure GP2. The upper intentionally undoped or lightly doped amorphous silicon layer 24c is deposited at a high gas pressure GP3. For this reason, the etching rate is increased from the lower intentionally undoped or lightly doped amorphous silicon layer 24a toward the upper intentionally undoped or lightly doped amorphous silicon layer 24c.

Figure 3A:
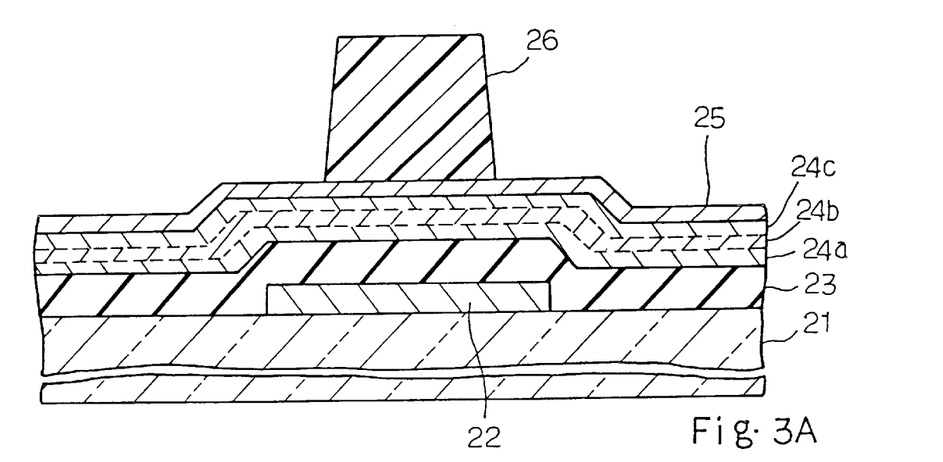
FIGS. 3A to 3D are cross sectional views showing a process of fabricating a thin film transistor according to the present invention.

After the deposition of the heavily doped n-type amorphous silicon layer 25, photo-resist is spun onto the heavily doped n-type amorphous silicon layer 25, and a pattern image is optically transferred to the photo-resist layer. The photo-resist layer is developed, and a photo-resist etching mask 26 is formed from the photo-resist layer as shown in FIG. 3A.

Using the photo-resist etching mask 26, the heavily doped n-type amorphous silicon layer 25 and the intentionally undoped or lightly doped amorphous silicon layers 24c, 24b and 24a are patterned to a heavily doped n-type amorphous silicon strip 25a and intentionally undoped or lightly doped amorphous silicon strips 24ca, 24ba and 24aa by using a dry etching. The intentionally undoped or lightly doped amorphous silicon strips 24aa to 24ca form in combination an active layer 24. In this instance, SF$_6$, Cl$_2$ and H$_2$ form etching gas during the dry etching.

The etching rate is increased from the lower intentionally undoped or lightly doped amorphous silicon layer 24a toward the upper intentionally undoped or lightly doped amorphous silicon layer 24c, and the upper intentionally undoped or lightly doped amorphous silicon layer 24c is widely etched rather than the lower intentionally undoped or lightly doped amorphous silicon layer 24a. For this reason, shoulder portions 24d and 24e take place on both sides of a central portion 24f of the active layer 24, and shoulder portions 24d and 24e downwardly decline from the central portion 24f.

Moreover, the larger the etching rate is, the smaller the taper angle is. The taper angle of the upper intentionally undoped or lightly doped amorphous silicon strip 24ca is the smallest, and the taper angle of the intermediate intentionally undoped or lightly doped amorphous silicon strip 24ba is smaller than the taper angle of the lower intentionally undoped or lightly doped amorphous silicon strip 24ca. For this reason, smooth side surfaces form the shoulder portions 24d and 24e.

The reason why the gas pressure changes the etching rate is that the chemical vapor deposition under a higher gas pressure increases the defect density of the amorphous silicon layer. When the defect density is increased, the amorphous silicon layer increases the dangling bonds, and the large amount of dangling bonds enhance the reaction probability with the species of the etchant. Therefore, the dry etching rapidly proceeds in the amorphous silicon layer deposited through the chemical vapor deposition under a high pressure gaseous ambience as indicated by plots PL3 of FIG. 5.

Figure 5:
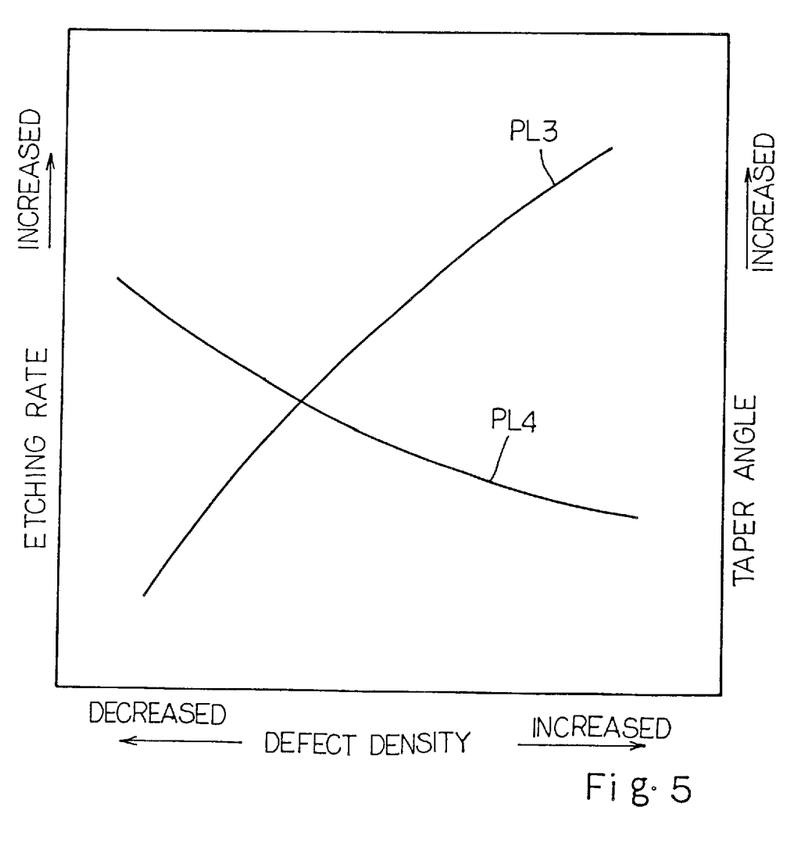
FIG. 5 is a graph showing an etching rate and a taper angle in terms of a defect density.

On the other hand, when the defective density of the amorphous silicon layer is increased, the taper angle is inversely decreased as indicated by plots PL4. This is because of the fact that the dry etching is the total of the ionic reaction of the etchant and the radical reaction. The ionic reaction results in an anisotropic etching, and the radical reaction proceeds an isotropic etching. The dangling bonds tend to react with the radicals of the etchant, and a large amount of dangling bonds promote the isotropy. In this instance, the dangling bonds are the smallest in the lower intentionally undoped or lightly doped amorphous silicon layer 24a, and the etchant tends to anisotropically etch the lower intentionally undoped or lightly doped amorphous silicon layer 24a. This means the anisotropy, and the taper angle is the largest of all. On the other hand, the dangling bonds is the largest in the upper intentionally undoped or lightly doped amorphous silicon layer 24c, and the isotropy dominates the dry etching on the upper intentionally undoped or lightly doped amorphous silicon layer 24c. This results in the smallest taper angle.

Figure 3B:
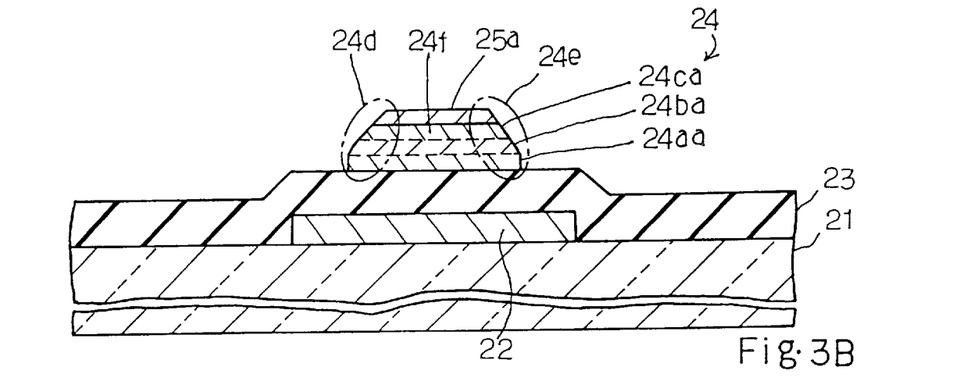
Figure 3C:
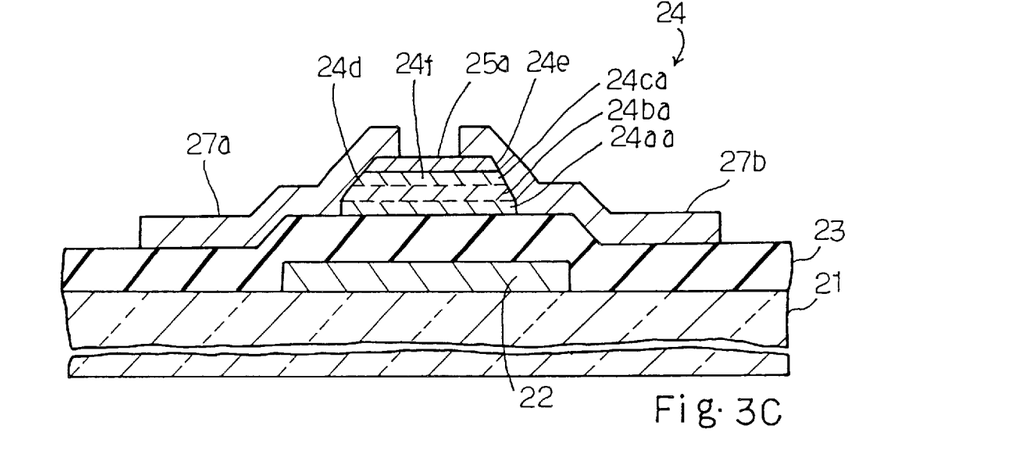

Upon completion of the active layer 24, a conductive layer of chromium is deposited over the entire surface of the resultant structure shown in FIG. 3B, and extends over the shoulder portions 24d and 24e of the active layer 24. The shoulder portions 24d and 24e are so smooth that the step coverage is surely improved. The conductive layer is patterned into a source electrode 27a and a drain electrode 27b by using the lithographic techniques, and the source electrode 27a and the drain electrode 27b are respectively held in contact with the shoulder portions 24d and 24e as shown in FIG. 3C.

Figure 3D:
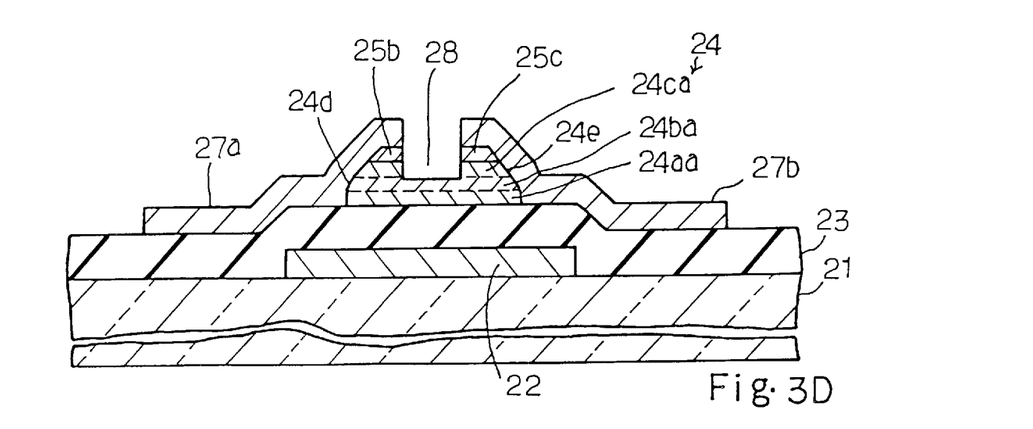

Finally, the heavily doped n-type amorphous silicon strip 25a is partially removed by using a dry etching, and a recess 28 is formed in the active layer 24 as shown in FIG. 3D. The recess 28 splits the heavily doped n-type amorphous silicon strip 25a into heavily doped n-type amorphous silicon pads 25b and 25c, and the source electrode 27a and the rain electrode 7b are held in contact with the heavily doped n-type amorphous silicon pads 25b and 25c, respectively.

As will be understood from the foregoing description, the source electrode 27a and the drain electrode 27b are held in contact with the shoulder portions 24d and 24e, and are less liable to be disconnected. This results in high production yield.

The amorphous silicon layers 24aa to 23ca are successively deposited over the gate insulating layer 23, and the relation between the etching rate and the etching gate pressure is clear. For this reason, the process is simple, and the shoulder portions 24d and 24e are reproducible.

Second Embodiment

Turning to FIGS. 6A to 6D of the drawings, a thin film transistor is fabricated through another process embodying the present invention. The thin film transistor is of the type having a channel protecting layer.

The process starts with preparation of a transparent substrate 31 of glass. A gate electrode 32 is patterned on a major surface of the transparent substrate 31, and a gate insulating layer 33 is deposited on the gate electrode 32 and the exposed surface of the major surface by using the plasma-assisted vapor deposition system 34.

Figure 6A:
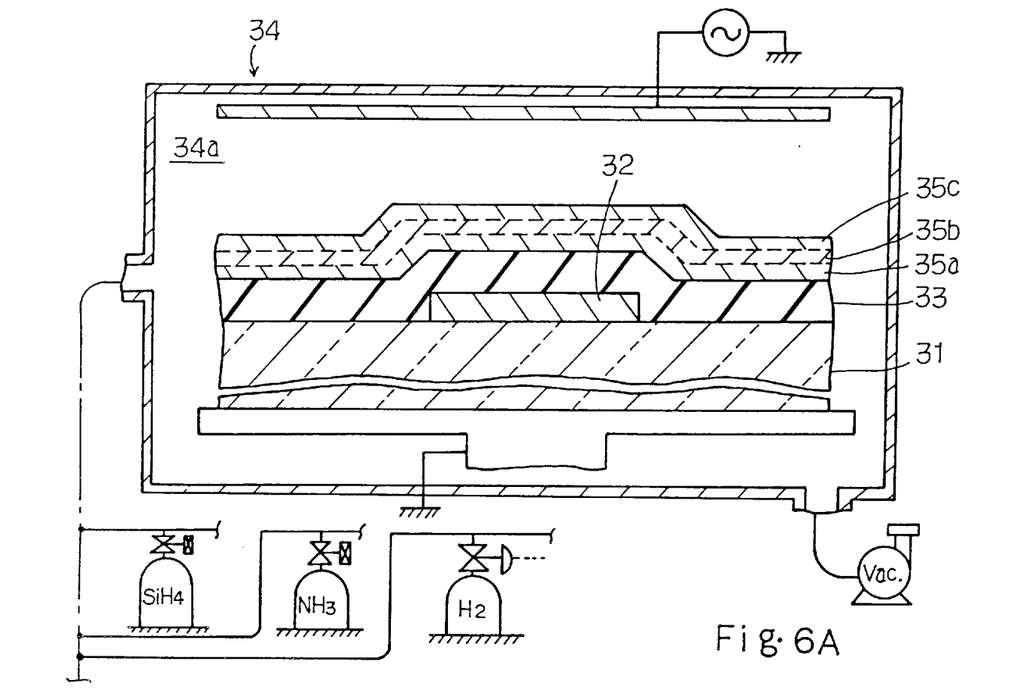
FIGS. 6A to 6D are cross sectional views showing another process of fabricating a thin film transistor according to the present invention.
Figure 7:
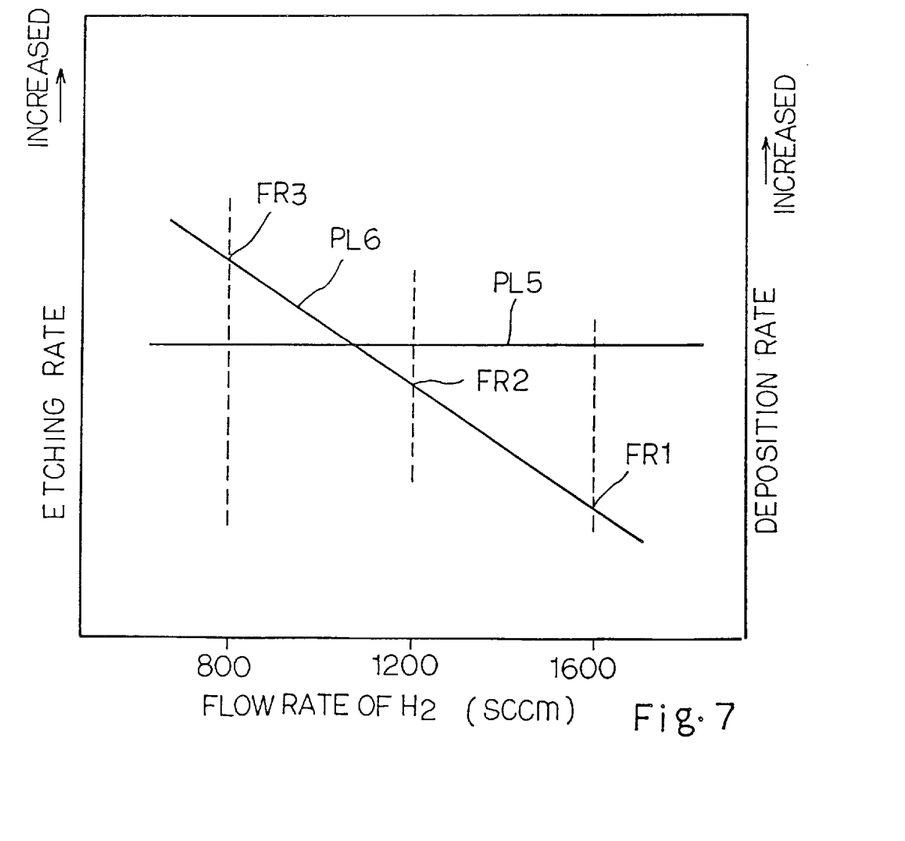
FIG. 7 is a graph showing an etching rate and a deposition rate in terms of a hydrogen flow rate.

Thereafter, a first amorphous silicon layer 35a, a second amorphous silicon layer 35b and a third amorphous silicon layer 35c are successively deposited over the gate insulating layer 33 by changing the flow rate of hydrogen as shown in FIG. 6A. In detail, gaseous mixture of silane and hydrogen is supplied to the reaction chamber 34a of the plasma-assisted chemical vapor deposition system 34, and the pressure of the gaseous mixture is constant. However, the flow rate of the hydrogen is stepwise decreased from the first amorphous silicon layer 35a to the third amorphous silicon layer 35c. As shown in FIG. 7, although the flow rate of the hydrogen does not affect the deposition rate as indicated by plots PL5, the etching rate on the deposited amorphous silicon layer is increased by decreasing the flow rate as indicated by plots PL6. The reason why the flow rate of the hydrogen affects the etching rate is that the decrease of the flow rate increases the amount of dangling bonds of the amorphous silicon. In this instance, the first amorphous silicon layer 35a, the second amorphous silicon layer 35b and the third amorphous silicon layer 35c are deposited at the flow rates FR1, FR2 and FR3, respectively.

The other depositing conditions are as follows. The flow rate of the silane is 300 sccm, the gaseous mixture is regulated to 100 Pa, and the rf power is 100 watts.

Subsequently, silicon nitride is deposited over the third amorphous silicon layer 35c, and the third amorphous silicon layer 35c is overlain by a silicon nitride layer. The silicon nitride layer is patterned into a channel protective layer 36 covering a back-channel region in the third amorphous silicon layer 35c.

Heavily doped n-type amorphous silicon is deposited over the channel protective layer 36 and the exposed surface of the third amorphous silicon layer 35c by using the chemical vapor deposition system 34, and a heavily doped n-type amorphous silicon layer 37 covers the channel protective layer 37 and the exposed surface of the third amorphous silicon layer 35c.

Photo-resist solution is spun onto the heavily doped n-type amorphous silicon layer 37, and a pattern image is optically transferred to the photo-resist layer. The photo-resist layer is developed, and a photo-resist etching mask 38 is provided on the heavily doped n-type amorphous silicon layer 37 as shown in FIG. 6B.

Figure 6B:
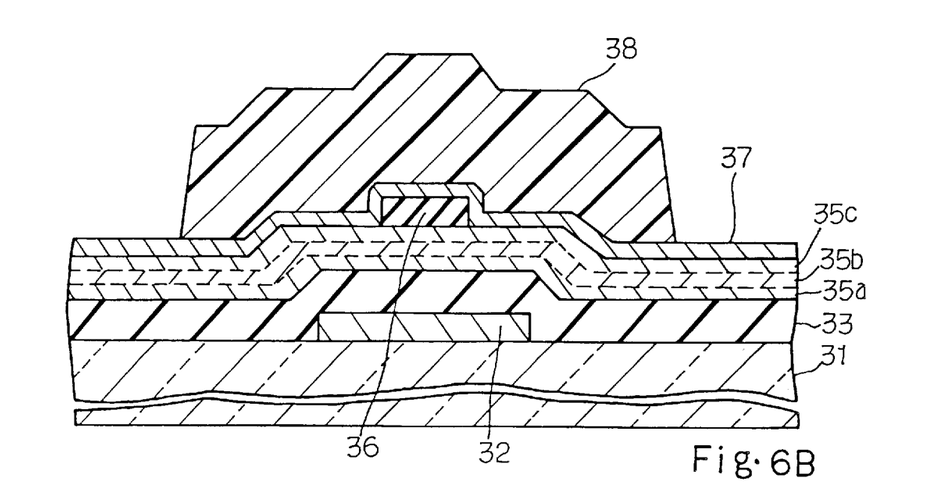

The resultant structure shown in FIG. 6B is placed in a dry etching system (not shown), and the heavily doped n-type amorphous silicon layer 37, the third, second and first amorphous silicon layers 35c, 35b and 35a are selectively etched away. A heavily doped n-type amorphous silicon strip 37a and an active layer 35 are left on the gate insulating layer 33, and a first amorphous silicon strip 35aa, a second amorphous silicon strip 35ba and a third amorphous silicon strip 35ca form in combination the active layer 35. The photo-resist etching mask 38 is stripped off after the dry etching. The resultant structure is illustrated in FIG. 6C.

As described hereinbefore, the etching rate is increased from the first amorphous silicon layer 35a toward the third amorphous silicon layer 35c, and shoulder portions 35d and 35e take place in both end portions of the active layer 35. The shoulder portions 35d and 35e downwardly decline from the third amorphous silicon strip 35ca toward the gate insulating layer 33, and, accordingly, the active layer 35 is tapered from a central portion thereof. The first amorphous silicon layer 35a is anisotropically etched into the first amorphous silicon strip 35aa, and the bode edges of the first amorphous silicon strip 35aa is substantially aligned with the photo-resist etching mask 38.

Figure 6C:
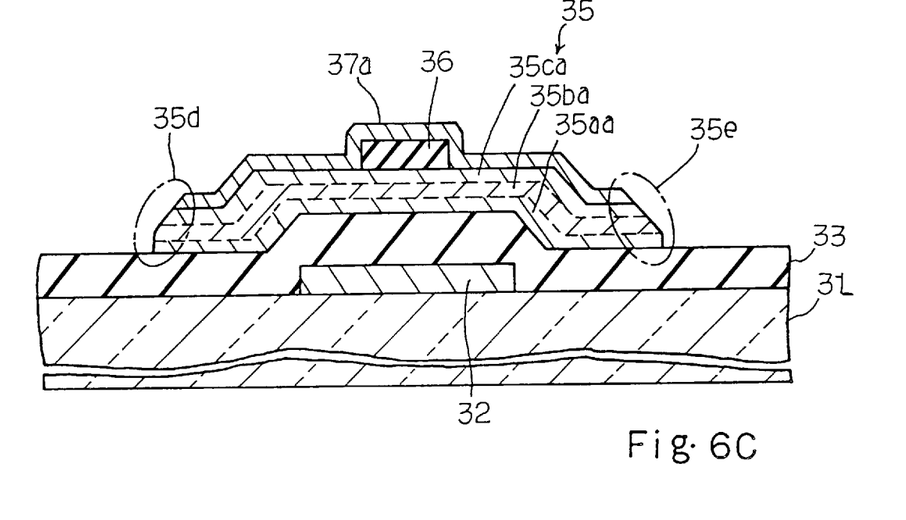

Conductive metal such as, for example, chromium is deposited over the entire surface of the resultant structure shown in FIG. 6C, and the chromium layer is patterned into a source electrode 38a and a drain electrode 38b. The gently declining shoulder portions 35d/35e improve the step coverage of the chromium layer, and the source electrode 38a and the drain electrode 38b are not disconnected.

Figure 6D:
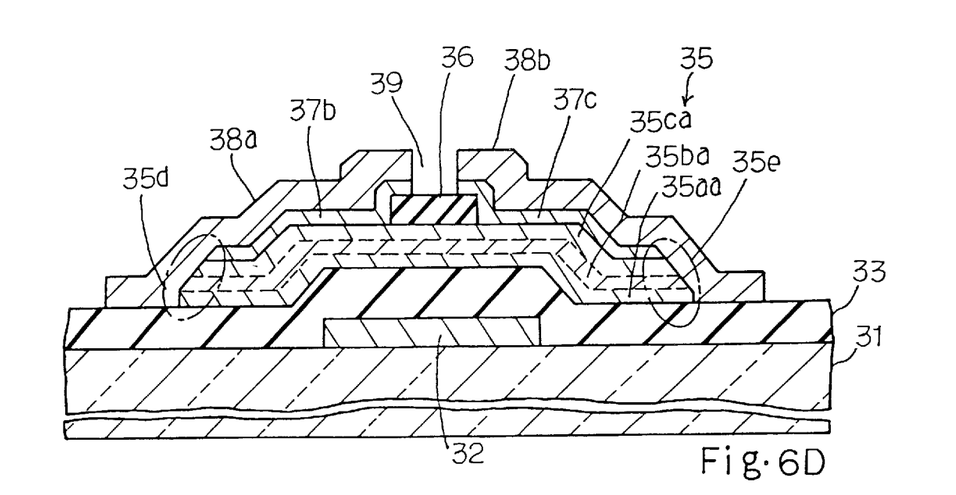

The heavily doped n-type amorphous silicon strip 37a is partially exposed to a gap 39 between the source electrode 38a and the drain electrode 38b, and the exposed portion of the heavily doped n-type amorphous silicon strip 37a is etched away. As a result, the heavily doped n-type amorphous silicon strip 37a is split into heavily doped n-type amorphous silicon pads 37b and 37c, and the source electrode 38a and the drain electrode 38b are held in contact with the shoulder portions 35d/35e and the heavily doped n-type amorphous silicon pads 37b/37c as shown in FIG. 6D.

The process sequence shown in FIGS. 6A to 6D are simple, and the thin film transistor is reproducible as similar to the first embodiment.

Third Embodiment

Figure 8:
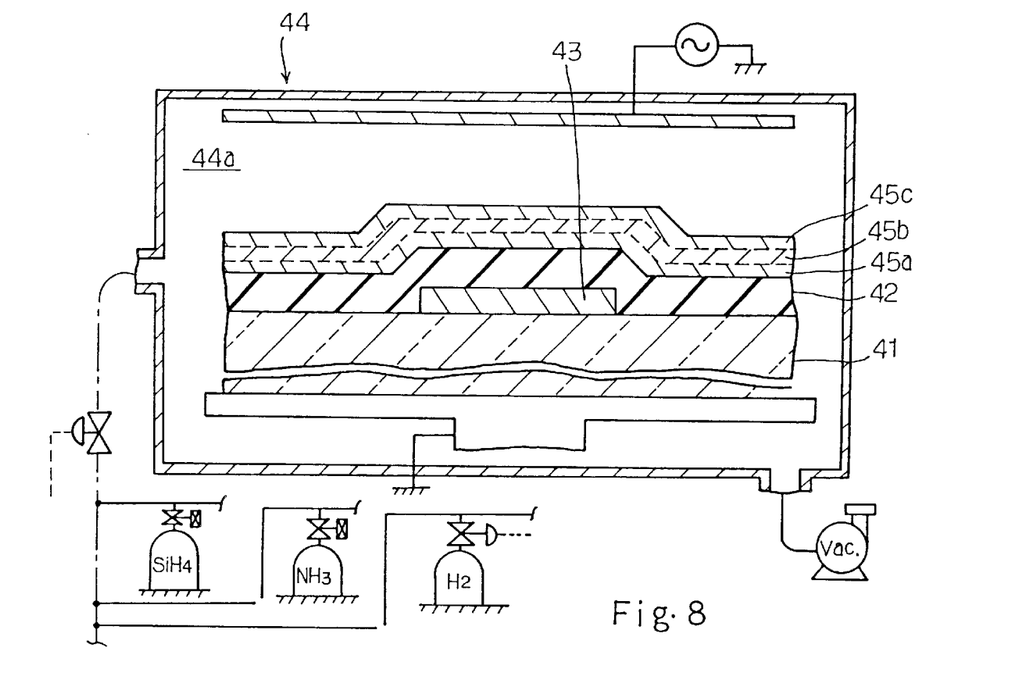
FIG. 8 is a cross sectional view showing an essential step of yet another process according to the present invention.

FIG. 8 illustrates an essential step of a process of fabricating a thin film transistor embodying the present invention. The process starts with preparation of a transparent substrate 41 of glass. A gate electrode 42 is patterned on a major surface of the transparent substrate 41, and a gate insulating layer 43 is deposited on the gate electrode 42 and the exposed surface of the major surface by using the plasma-assisted vapor deposition system 44.

Thereafter, a first amorphous silicon layer 45a, a second amorphous silicon layer 45b and a third amorphous silicon layer 45c are successively deposited over the gate insulating layer 43 by changing both of the pressure of the process gas and the flow rate of hydrogen as shown in FIG. 8.

In detail, gaseous mixture of silane and hydrogen is supplied to the reaction chamber 44a of the plasma-assisted chemical vapor deposition system 44, and the plasma-assisted chemical vapor deposition is carried out at 100 watts. The flow rate of the silane is regulated to 300 sccm during the deposition of the first to third amorphous silicon layers 45a to 45c. While the first amorphous silicon layer 45a is being deposited on the gate insulating layer 42, the process gas is regulated to 100 Pa, and the flow rate of hydrogen is 1200 sccm. The second amorphous silicon layer 45b is deposited at the flow rate of 800 sccm under the pressure of 150 Pa, and the flow rate of hydrogen and the pressure of the process gas are changed to 800 sccm and 200 Pa.

After the deposition of the first to third amorphous silicon layers 45a to 45c, the process traces the steps shown in FIGS. 3A to 3D or 6B to 6D.

In the process implementing the third embodiment, two process parameters, i.e., the flow rate of hydrogen and the etching gate pressure are controlled, and the taper angle of the shoulder portions and the deposition rate become larger.

Although particular embodiments of the present invention have been shown and described, it will be obvious to those skilled in the art that various changes and modifications may be made without departing from the spirit and scope of the present invention.

For example, the defect density of the first to third amorphous silicon layers 24a to 24c may be varied by changing the flow rate of the hydrogen, and the defect density of the first to third amorphous silicon layers 35a to 35c may be controlled by changing the pressure of the process gas.

Moreover, an active layer may be formed from two or more than three amorphous silicon layers.

In the above described embodiments, the amorphous silicon is used for the active layer. The process sequences of the present invention is applicable to shoulder portions of polysilicon or microcrystal silicon.

What is claimed is:

1. A thin film transistor comprising:

a gate electrode formed on an insulating layer;

a gate insulating layer covering said gate electrode;

a multiple-layer semiconductor structure having a central portion and shoulder portions downwardly declining from said central portion, and having at least a lower semiconductor layer formed on said gate insulating layer and an upper semiconductor layer formed over said lower semiconductor layer larger in defect density than said lower semiconductor layer, but otherwise identical to said lower semiconductor layer;

heavily doped semiconductor strips respectively held in contact with said shoulder portions; and source and drain electrodes respectively held in contact with said heavily doped semiconductor strips.

2. The thin film transistor as set forth in claim 1, in which said lower semiconductor layer and said upper semiconductor layer are formed of a semiconductor material selected from the group consisting of amorphous silicon, polysilicon and microcrystal silicon.

3. The thin film transistor as set forth in claim 1, in which said insulating layer is a transparent substrate.

4. The thin film transistor as set forth in claim 3, in which said transparent substrate, said gate insulating layer and said gate electrode are formed of glass, silicon nitride and conductive non-transparent metal, respectively.

5. A process of fabricating a thin film transistor as claimed in claim 1, comprising the steps of:

a) patterning a gate electrode on an insulating layer;

b) covering said gate electrode and an exposed surface of said insulating layer with a gate insulating layer;

c) depositing semiconductor layers by using a chemical vapor deposition where at least one depositing condition is varied in such a manner as to increase a defect density from a lower semiconductor layer to an upper semiconductor layer;

d) etching said semiconductor layers so as to form shoulder portions downwardly declining toward both ends of said semiconductor layers; and e) forming a source electrode and a drain electrode on said shoulder portions, respectively.

6. The process as set forth in claim 5, in which said semiconductor layers are formed of amorphous silicon.

7. The process as set forth in claim 6, in which said at least one depositing condition is a pressure of a process gas containing silane and hydrogen.

8. The process as set forth in claim 6, in which said at least one depositing condition is a flow rate of hydrogen which forms a process gas together with silane.

9. The process as set forth in claim 6, in which a pressure of a process gas containing silane and hydrogen and a flow rate of said hydrogen are varied so as to increase said defect density in said step c).

10. The process as set forth in claim 6, in which a heavily doped amorphous silicon layer is further deposited on said semiconductor layers between said step c) and said step d), and said heavily doped amorphous silicon layer is patterned into a heavily doped amorphous silicon strip together with said semiconductor layers in said step d), said process further comprising the step of f) removing a portion of said heavily doped amorphous silicon strip exposed to a gap between said source electrode and said drain electrode after said step e) so that said source electrode and said drain electrode are held in contact through heavily doped amorphous silicon pads with said shoulder portions, respectively.

11. The process as set forth in claim 10, further comprising the step of forming a channel protective layer on said semiconductor layers between the deposition of said semiconductor layers and the deposition of said heavily doped amorphous silicon layer.

12. The process as set forth in claim 6, in which said semiconductor layers are deposited by using a plasma-assisted chemical vapor deposition system.

13. A thin film transistor as claimed in claim 1, wherein said multiple-layer semiconductor structure comprises at least three layers.

* * * * *